United States Patent
Wasserfallen et al.

(10) Patent No.: US 10,280,513 B2
(45) Date of Patent: May 7, 2019

(54) METHOD FOR COATING METAL SURFACES OF SUBSTRATES AND OBJECTS COATED ACCORDING TO SAID METHOD

(71) Applicant: Chemetall GmbH, Frankfurt am Main (DE)

(72) Inventors: Daniel Wasserfallen, Mainz (DE); Michael Schwamb, Frankfurt (DE); Aliaksandr Frenkel, Frankfurt (DE); Vera Sotke, Frankfurt am Main (DE); Wolfgang Bremser, Paderborn (DE); Martin Droll, Schlangen (DE); Oliver Seewald, Marsberg (DE); Ron Eilinghoff, Frankfurt (DE); Stephanie Gerold, Paderborn (DE); Evgenija Niesen, Soest (DE); Lars Schachtsiek, Paderborn (DE); Manuel Traut, Hamm (DE); Philipp Klöpzig, Darmstadt (DE)

(73) Assignee: Chemetall GmbH, Frankfurt am Main (DE)

( * ) Notice: Subject to any disclaimer, the term of this patent is extended or adjusted under 35 U.S.C. 154(b) by 176 days.

(21) Appl. No.: 14/903,677

(22) PCT Filed: Jul. 16, 2014

(86) PCT No.: PCT/EP2014/065281
§ 371 (c)(1),
(2) Date: Jan. 8, 2016

(87) PCT Pub. No.: WO2015/007789
PCT Pub. Date: Jan. 22, 2015

(65) Prior Publication Data
US 2016/0168711 A1 Jun. 16, 2016

(30) Foreign Application Priority Data

Jul. 18, 2013 (DE) .................. 10 2013 214 084

(51) Int. Cl.
| | | |
|---|---|---|
| C09D 5/08 | (2006.01) |
| C23C 16/56 | (2006.01) |
| B05D 1/00 | (2006.01) |
| C23C 18/12 | (2006.01) |
| C09D 101/02 | (2006.01) |
| C09D 103/02 | (2006.01) |
| C09D 103/12 | (2006.01) |
| C09D 105/00 | (2006.01) |
| C09D 105/02 | (2006.01) |
| C09D 105/04 | (2006.01) |
| C09D 105/06 | (2006.01) |
| C09D 105/08 | (2006.01) |
| C09D 105/12 | (2006.01) |

(Continued)

(52) U.S. Cl.
CPC .............. *C23C 16/56* (2013.01); *C09D 5/02* (2013.01); *C09D 5/08* (2013.01); *C09D 101/02* (2013.01); *C09D 103/02* (2013.01); *C09D 103/12* (2013.01); *C09D 105/00* (2013.01); *C09D 105/02* (2013.01); *C09D 105/04* (2013.01); *C09D 105/06* (2013.01); *C09D 105/08* (2013.01); *C09D 105/12* (2013.01); *C09D 133/04* (2013.01); *C09D 189/00* (2013.01); *C09D 189/06* (2013.01); *C09D 197/005* (2013.01); *C23C 18/125* (2013.01); *C08L 2205/025* (2013.01); *C25D 9/10* (2013.01)

(58) Field of Classification Search
CPC . B05D 1/00; B05D 1/18; B05D 3/102; B05D 2202/00; C23C 16/56; C09D 5/08
USPC ........................................ 427/385.5
See application file for complete search history.

(56) References Cited

U.S. PATENT DOCUMENTS

| | | | | |
|---|---|---|---|---|
| 4,678,032 A | * | 7/1987 | Shu ................. | C09K 8/887 166/295 |
| 5,433,976 A | * | 7/1995 | van Ooij .......... | B05D 7/16 427/327 |

(Continued)

FOREIGN PATENT DOCUMENTS

WO   WO-2012034974 A1 * 3/2012 ............. B05D 7/142

OTHER PUBLICATIONS

Montemor, M.E, et al., "Modification of bis-silane solutions with rare-earth cations for improved corrosion protection of galvanized steel substrates", Progress in Organic Coatings, 57 (2006) p. 67-77 (11 pages).

(Continued)

*Primary Examiner* — Dah-Wei D. Yuan
*Assistant Examiner* — Hai Y Zhang
(74) *Attorney, Agent, or Firm* — Armstrong Teasdale LLP

(57) ABSTRACT

The invention relates to a method for coating surfaces, to a corresponding coating, and to the use of the objects coated according to said method. According to the invention, the method has or consists of the following steps: I. providing a substrate with a cleaned surface, II. contacting and coating the surfaces with an aqueous composition in the form of a dispersion and/or suspension, VI. if necessary rinsing the organic coating, and VII. drying and/or baking the organic coating or VIII. if necessary drying the organic coating and carrying out a coating process using a similar or additional coating composition prior to a drying and/or baking process, wherein between step I and step II, the coating process is carried out using an aqueous composition in the form of a dispersion and/or suspension on the basis of a colloidal silicate sol, which incorporates multivalent metal cations, or a silane- or silicate-modified polymer and if necessary a rinsing process is carried out.

21 Claims, No Drawings

(51) Int. Cl.
*C09D 189/00* (2006.01)
*C09D 189/06* (2006.01)
*C09D 197/00* (2006.01)
*C09D 133/04* (2006.01)
*C09D 5/02* (2006.01)
*C25D 9/10* (2006.01)

(56) References Cited

U.S. PATENT DOCUMENTS

| | | | | |
|---|---|---|---|---|
| 6,083,309 | A * | 7/2000 | Tomlinson | C23C 22/34 106/14.11 |
| 2001/0050231 | A1 * | 12/2001 | Heimann | C23C 28/00 204/499 |
| 2008/0280046 | A1 * | 11/2008 | Bryden | C23C 22/34 427/327 |
| 2011/0212326 | A1 * | 9/2011 | Ettrich | B05D 1/185 428/335 |
| 2013/0344310 | A1 * | 12/2013 | Wasserfallen | B05D 7/142 428/216 |

OTHER PUBLICATIONS

Trabelsi, W., et al., "The use of pre-treatments based on doped silane solutions for improved corrosion resistance of galvanised steel substrates", Surface & Coatings Technology, 200 (2006) p. 4240-4250 (11 pages).
Snowtex® 0: 20% colloidal silica in water, Dec. 6, 2010, 7 pages.
Gardobond® Additive H7107: aqueous solution of 25-50 wt.-% zinc nitrate, Jul. 12, 2017, 16 pages.
Gardobond® Oxsilan® Additive 9906: aqueous solution of 1-2,5 wt.-% hexafluorozirconic acid and 3-5 wt.-% manganese nitrate, Jun. 28, 2017, 15 pages.
Gardobond® Oxsilan® Additive 9951: aqueous solution of 3-10 wt.-% sodium carbonate, Jun. 30, 2017, 13 pages.

* cited by examiner

METHOD FOR COATING METAL SURFACES OF SUBSTRATES AND OBJECTS COATED ACCORDING TO SAID METHOD

REFERENCE TO RELATED APPLICATIONS

This is a National Stage entry of International Patent Application PCT/EP2014/065281, filed on Jul. 16, 2014, which application claims priority from German Application No. 102013214084.3, filed Jul. 18, 2013. Each patent application identified above is incorporated herein by reference in its entirety.

The invention relates to a method for coating surfaces, a corresponding coating and the use of the objects coated according to this method. There are numerous methods for producing homogeneous coatings on metallic surfaces in particular by means of immersion methods. In doing so, the following techniques are preferably used for creating anticorrosion coatings consisting primarily of an organic matrix and/or organic and/or inorganic additive components.

The traditional methods are based on use of the rheological properties of the formulations that are used in order to achieve a complete coating of a joined workpiece. Although an accumulation of coating material in critical locations can be reduced by continuous rotation of the respective workpiece after the immersion process, it is impossible with this method to achieve a completely homogeneous coating. In addition defects such as bubbles and pits that have a negative effect on the quality of the coating as a whole may occur in locations with larger amounts of coating during the drying and/or crosslinking process.

Electrophoretic methods avoid these problems by using an electric current to deposit a uniform coating in immersion. With this method it is possible to homogeneous coatings on metallic workpieces. The coatings that are deposited exhibit extremely good adhesion in the wet state to the metallic substrate, which allows treatment of the workpiece in a subsequent rinsing step without separation of the coating. As a result, the aforementioned locations on the workpiece which are difficult to access can be freed of excess coating solution and therefore no defects can be formed during the drying process. This technique has the disadvantage that, in addition to the amount of electricity required and, in addition to suitable immersion basins, which result in increased costs and also so-called edge alignment, occur because electric fields are built up non-homogeneously on macroscopic edges, and the edges are coated uniformly and possibly even incompletely. In the design of the workpieces, it is also necessary to avoid cavities because an effect comparable to the Faraday cage phenomenon occurs in these locations. Because of the reduction in the electric field strengths required for deposition, only a greatly reduced coating can be applied by this method (wrap-around problem) or none at all in such regions of the workpiece, which results in a negative effect on the coating quality. In addition, this technique has the following disadvantages in electro dip coating (EDC) such as in cathodic dip coating (CDC): a corresponding immersion bath has a very complex structure, including all the electric and mechanical devices of temperature management, power supply and electrical installation, circulation devices and additional devices, including disposal of the anolyte acid formed in electrolytic coating and with ultrafiltration for recycling the coating as well as control devices. The process management also requires a very high technical complexity, due to the high amperages and large quantities of energy in both the standardization of the electric parameters based on the bath volume and the accurate adjustment of all process parameters and in maintenance and cleaning of the installation.

The known autophoretic processes are based on a currentless concept, consisting of a pickling attack on the substrate surface, in which metal ions are dissolved out of the surface and an emulsion is coagulated because of the concentration of metallic ions at the resulting interface. Although these methods do not exhibit the aforementioned restriction of the electrolytic methods with respect to the Faraday cage effect, the coatings formed in the process must be set in a complex multistage immersion process after the initial activation step. In addition, the pickling attack leads to unavoidable contamination of the active zone by metal ions that must be removed from the zones. Furthermore, the method is based on a chemical deposition process that is not self-regulating and cannot be terminated on demand, e.g., due to powering down the electric current in the electrolytic processes. Thus, the development of an excessively thick layer is unavoidable with a longer dwell time of the metallic substrates in the active zones.

There has long been a desire to form homogenous coatings in an immersion process efficiently and inexpensively in order to produce the most closed possible and essentially level coatings with a greater thickness from them.

The object is therefore a method for coating metallic surfaces of substrates, comprising or consisting of the steps:
I. Supplying a substrate having a cleaned metallic surface,
II. Contacting and coating metallic surfaces with an aqueous composition in the form of a dispersion and/or suspension,
III. Optionally rinsing the organic coating and
IV. Drying and/or baking the organic coating or
V. Optionally drying the organic coating and forming another coating having a similar or additional coating composition before drying and/or baking, wherein between step I and step II, the coating is applied with an aqueous composition in the form of a dispersion and/or suspension, based on a colloidal silicatic sol incorporating polyvalent metal cations or a silane- or silicate-modified polymer and optionally a rinsing operation.

The coating according to the invention has a single-layer structure, wherein either a coating or a more or less homogeneous coating is formed and/or may be present, in which the particles are enriched to a somewhat greater extent close to the surface.

The substrates with a metallic surface to be coated are understood according to the invention as follows: metals, metal-coated surfaces or metal surfaces pretreated with primers, from which metal cations can still be released. In particular the term "surface(s) to be coated" in the sense of this patent application includes surfaces of metallic objects and/or metallic particles, which may optionally be precoated with a metallic coating based on zinc or a zinc alloy and/or with at least one coating of a pretreatment or treatment composition, for example, based on chromate, $Cr^{3+}$, Ti compound, Zr compound, silane/silanol/siloxane/polysiloxane and/or an organic polymer. Substrates that may be used include all surfaces that can be coated with an adhering colloidal silicatic sol incorporating polyvalent metal cations or a silane- or silicate-modified polymer. The term "adhering" is understood in the sense of the present invention to mean that it cannot be removed by rinsing in a dip process and/or a spray process using deionized water.

Of the metallic materials, basically all types of metallic materials are possible, in particular those made of aluminum, iron, copper, titanium, zinc, tin and/or alloys containing aluminum, iron, steel, copper, magnesium, nickel, titanium, zinc and/or tin, wherein they may also be used side by side and/or one after the other. The material surfaces may optionally also be precoated, for example, with zinc or an alloy containing aluminum and/or zinc.

Fundamentally all types of objects made of a metallic material or provided with at least one metallic coating may be used as the object to be coated. Especially preferred objects include in particular strips (coils), sheet metal, parts such as small parts, joined components, components with complex shapes, profiles, rods and/or wires.

The term "currentless coating" in the sense of this patent application means that, in contrast with the known electrolytic methods for producing the follow-up coating, an electric voltage of less than 100 V is applied externally in coating with the composition containing the solution and/or dispersion (=suspension and/or emulsion) in contrast with the known electrolytic methods for producing the follow-up coating.

The invention preferably relates to a method in which the gelling agent a) contains or consists of at least one polysaccharide, based on glycogens, amyloses, amylopectins, calloses, agar, algins, alginates, pectins, carrageenan, celluloses, chitins, chitosans, curdlans, dextrans, fructans, collagens, gellan gum, gum arabic, starch, xanthans, gum tragacanth, karayans, tara gum and glucomannans; b) at least one gelling agent of natural origin, based on polyamino acids, collagens, polypeptides, lignins and/or c) at least one synthetic gelling agent, based on polyamino acids, polyacrylic acids, polyacrylic acid copolymers, acrylamide copolymers, lignins, polyvinyl sulfonic acid, polycarboxylic acids, polyphosphoric acids or polystyrenes.

The gelling agent especially preferably contains or consists of at least one polysaccharide based on pectins and/or gellan gum.

The method according to the invention is preferably one in which the aqueous composition and/or the organic coating produced from it contains at least one type of cations selected from those based on salts with a cationic effect, selected from the group consisting of melamine salts, nitroso salts, oxonium salts, ammonium salts, salts with quaternary nitrogen cations, salts of ammonium derivatives and metal salts of Ag, Al, Ba, Ca, Co, Cu, Fe, In, Mg, Mn, Mo, Ni, Pb, Sn, Ta, Ti, V, W, Zn and/or Zr.

The term "copolymers" in the sense of this patent application describes polymers comprised of two or more different types of monomer units. Copolymers here can be divided into five classes, as will be illustrated on the basis of a binary copolymer made up of two different comonomers A and B:
1. Random copolymers in which the distribution of the two monomers in the chain is random (AABABBBABAABB-BABBABAB . . . );
2. Gradient copolymers, resembling random copolymers in principle, but having a variable amount of monomer in the course of the chain (AAAAAABAABBAABABB-BAABBBBBB);
3. Alternating copolymers with a regular arrangement of the monomers along the chain (ABABABABABABABA-BABAB . . . );
4. Block copolymers consisting of longer sequences or blocks of each monomer (AAAAAAAABBBBBBBBBBBB . . . ), wherein depending on the number of blocks, we can also speak of diblock, triblock, multi-block copolymers;
5. Graft copolymers, in which blocks of a monomer are grafted onto the backbone of another monomer.

The term "derivatives" in the sense of this patent application denotes a derived substance having a structure similar to that of a corresponding basic substance. Derivatives are substances, whose molecules have another atom or a different atomic group instead of an H atom or a functional group and/or in which one or more atoms/atomic groups have been removed.

The term "polymer(s)" in the sense of this patent application denotes monomer(s), oligomer(s), polymer(s), copolymer(s), block copolymer(s), graft copolymer(s), mixtures thereof and their compounds on an organic and/or essentially organic basis. The "polymer(s)" in the sense of this patent application is (are) usually present primarily or entirely as polymer(s) and/or copolymer(s).

The method according to the invention is especially preferably one in which the aqueous composition and/or the organic coating produced from it contain(s) an amount of film-forming binders based on polyacrylates, polyurethanes, polyepoxides and/or their hybrids.

So-called polyacrylate-polyurethane hybrid resins of this type can be differentiated according to hybrid systems which are created by simply mixing the different dispersions (blends or formulations) into those having a chemical bond between the different types of polymers and those in which the different classes of polymers form interpenetrating networks (IPN).

Such polyurethane-polyacrylate hybrid dispersions are usually prepared by emulsion polymerization of a vinyl polymer ("polyacrylate") in an aqueous polyurethane dispersion. However, it is also possible to produce the polyurethane-polyacrylate hybrid dispersion as a secondary dispersion.

Aqueous polyacrylate-polyepoxy hybrid dispersions are usually prepared by addition reactions of a bifunctional epoxy with bifunctional amine monomer building blocks and then a reaction with a polyacrylate having enough carboxyl functions. As with the polyurethane secondary dispersions, water dispersibility can be achieved by carboxylate groups, for example, which have been converted into anionic groups with amines and then dispersing in water.

Hybrid dispersions for forming a layer on the substrate may preferably also contain, in addition to polyurethane and polyepoxy ingredients, organic polymers and/or copolymers based on polyvinyl alcohols, polyvinyl acetates, polybutyl acrylates and/or other acrylic acid esters. Acrylic acid esters are esters derived from acrylic acid ($CH_2=CH-COOH$) and thus having the functional group ($CH_2=CH-COOR$). Acrylic acid methyl esters, acrylic acid ethyl esters, acrylic acid butyl esters and ethyl hexyl acrylate are produced in large quantities. The main use of acrylic acid esters is in homopolymers and copolymers, which contain, for example, acrylic acid, acrylamides, methacrylates, acrylonitrile, fumaric acids, itaconic acid, maleates, vinyl acetate, vinyl chloride, styrene, butadiene and unsaturated polyesters, polyepoxide esters, polyacrylamides, polyacrylic acids, polycarbonates, polyesters, polyethers, polystyrene butadienes, poly(meth)acrylic acid esters, polyvinyl acetate copolymers with acrylic acid esters and/or copolymers with dibutyl maleate and/or with vinyl esters of at least one Koch acid, polyethylenes, polyvinyl chlorides, polyacrylonitriles, polyepoxies, polyurethanes, polyacrylates, polymethacrylates, polyesters, polyamides, polytetrafluoroethylenes, polyisobutadienes, polyisoprenes, silicones, silicone rubbers and/or their derivatives. These are present in particular in amounts of at least 50 wt % of the solid ingredients and active ingredients in the aqueous composition.

The term "pretreatment" refers to a treatment (=bringing the surfaces to be coated in contact with a composition, usually liquid), in which another coating is applied to protect the layer sequence and the object such as at least one lacquer, for example, optionally after a subsequent coating.

In the case of a prior pretreatment before activation of a surface with an activating agent that should help to charge the surface electrostatically, the surfaces to be treated may first be given an alkaline cleaning, if necessary, and optionally brought in contact with a composition for pretreatment, the latter in particular to form a conversion layer. Then the surfaces treated and/or coated in this way may optionally be coated and/or optionally oiled with a primer and/or with an optionally reshapeable protective layer, in particular with an anticorrosion primer. Oiling serves in particular to provide temporary protection for the treated and/or coated surfaces, in particular metallic surfaces.

Basically any type of pretreatment is possible as a pretreatment. For example, aqueous pretreatment compositions based on phosphate, phosphonate, silane/silanol/siloxane/polysiloxane, a lanthanide compound, a titanium compound, a hafnium compound, a zirconium compound acid, a metal salt and/or an organic polymer may be used.

In further treatment of these coated substrates, an alkaline cleaning in particular may be performed, if needed, regardless of whether or not oil has been applied previously.

A coating with an anticorrosion primer such as, for example, a welding primer can provide additional corrosion protection in particular in cavities and in difficult to access sections of a substrate, while facilitating shapeability and/or joinability, for example, in folding, gluing and/or welding. In industrial practice, an anticorrosion primer could be used in particular when the substrate, such as sheet metal, coated with it is to be shaped after coating with the anticorrosion primer and/or is to be joined to another component and if additional coatings are only then to be applied. If an anticorrosion primer is additionally applied beneath the activation layer and beneath the polymer coating in this set of operations, then improved corrosion prevention is usually achieved.

The term "essentially rinse-fast" in the sense of this patent application means that under the conditions of the respective installation and process sequence, the last coating, respectively, is not removed entirely by a rinsing operation (=rinsing), so that a coating, preferably a closed coating, can be produced.

In the method according to the invention, a wide variety of types of particles, particle sizes and particle shapes may be used as the particles.

The particles to be used in the aqueous composition for forming the layer may preferably be oxides, hydroxides, carbonates, phosphates, phosphosilicates, silicates, sulfates, organic polymers, including copolymers and their derivatives, waxes and/or compounded particles, in particular those based anticorrosion pigments, organic polymers, waxes and/or compounded particles and/or mixtures thereof. They preferably have particle sizes in the range of 5 nm to 15 µm, from 8 nm to 5 µm or from 15 nm to 1.5 µm, in particular from 30 nm to 700 nm or from 50 nm to 500 nm. They are preferably water-insoluble particles.

Compounded particles have a mixture of at least two different substances in one particle. Compounded particles may often have other substances with very different properties. For example, they may entirely or partially contain the composition for a lacquer, optionally even containing substances not in particulate form such as surfactants, defoaming agents, dispersants, lacquer aids, additional types of additives, dyes, corrosion inhibitors, weakly water-soluble anticorrosion pigments and/or other substances that are customary and/or known for the corresponding mixtures. Such lacquer ingredients may be suitable and/or may often be used for organic coatings for shaping, for anticorrosion primers and other primers, for colored lacquers, fillers and/or clear lacquers.

An anticorrosion primer usually contains electrically conductive particles and can be welded electrically. In generally it is often preferably here that a) a mixture of chemically and/or physically different particles, b) particles, aggregates and/or agglomerates of chemically and/or physically different particles and/or c) compounded particles are used in the composition and/or in the particle layer formed from the composition.

In many cases, it is preferable for the composition containing the particles and/or the particle layer formed from it to also contain in addition to at least one type of particles, at least one non-particulate substance, in particular additives, dyes, corrosion inhibitors and/or weakly water-soluble anticorrosion pigments. In particular colored particles and/or optionally a limited amount of electrically conductive particles, in particular based on fullerenes and other carbon compounds with graphite-like structures and/or carbon black, optionally also nano containers and/or nanotubes may also be present as particles in the composition and/or in the particle layer formed from it. On the other hand, coated particles, chemically and/or physically modified particles, core-shell particles, compounded particles from various substances, encapsulated particles and/or nano containers may be used in particular as particles in the composition and/or in the coating formed from it.

With the method according to the invention, it is preferable for the composition containing the particles, the particle layer formed from it and/or the coating formed from it by creating a film and/or crosslinking the composition to contain, in addition to at least one type of particles, also at least one dye, one colored pigment, one anticorrosion pigment, one corrosion inhibitor, one conductivity pigment, another type of particles, a silane/silanol/siloxane/polysiloxane/silazane/polysilazane, a lacquer additive and/or an additive such as, for example, at least one surfactant, one defoaming agent and/or one dispersant.

With the method according to the invention, it is preferable for the composition and/or the coating formed from it to contain, either partially or completely, in addition to at least one type of particles and optionally in addition to at least one non-particulate substance, a chemical composition for a primer, a lacquer such as, for example, a filler, a top coat and/or a clear coat.

In many embodiments, pigments and/or additives, such as those often used in lacquers and/or primers, are recommended as additives to the organic polymers of the particles.

Formation of a film can be improved by use of thermoplastic polymers and/or by adding substances that serve as temporarily plasticizers. Film-forming aids act as specific solvents, which soften the surface of the polymer particles and thus enable their fusion. It is advantageous here if these plasticizers remain in the aqueous composition for a sufficiently long period of time, on the one hand, to be able to act on the polymer particles for a long time and then evaporate and thus escape from the film. Furthermore it is advantageous if a residual water content is also present for a sufficiently long period of time during the drying process.

So-called long-chain alcohols, in particular those having 4 to 20 carbon atoms, are advantageous as film-forming aids, such as:

butanediol
butyl glycol,
butyl diglycol,
ethylene glycol ether, such as ethylene glycol monobutyl ether,
ethylene glycol monoethyl ether,
ethylene glycol monomethyl ether,
ethyl glycol propyl ether,
ethylene glycol hexyl ether,
diethylene glycol methyl ether,
diethylene glycol ethyl ether,
diethylene glycol butyl ether,
diethylene glycol hexyl ether or a
polypropylene glycol ether such as
propylene glycol monomethyl ether,
dipropylene glycol monomethyl ether,
tripropylene glycol monomethyl ether,
propylene glycol monobutyl ether,
dipropylene glycol monobutyl ether,
tripropylene glycol monobutyl ether,
propylene glycol monopropyl ether,
dipropylene glycol monopropyl ether,
tripropylene glycol monopropyl ether,
propylene glycol phenyl ether,
trimethyl pentane diol diisobutyrate,
a polytetrahydrofuran,
a polyether polyol and/or a polyester polyol.

Crosslinking may take place, for example, with certain reactive groups, such as isocyanate groups, isocyanurate groups, phenol groups and/or melamine groups.

The subsequent coating is preferably dried in such a manner that, in particular, any organic polymer particles that are present can form a film so that a larger or completely homogenous coating is formed. In many embodiments, the drying temperatures can be selected to be so high that the organic polymer ingredients are able to crosslink.

In the method according to the invention, it is preferable in some embodiments that a particle layer containing essentially organic particles is formed and is crosslinked and/or a film is formed in drying, for example. The formation of a film in many embodiments takes place even without the presence of film-forming aids. The particles of the coating here preferably form a closed coating or an essentially closed coating in particular when the particles are present primarily or entirely as organic polymers, in particular in drying. It is often preferable for the drying temperature of a coating consisting primarily or entirely of organic polymers to be selected, so that a closed or essentially closed coating is formed. If necessary, at least one film-forming may be added to form the film, in particular a film-forming aid, based on at least one long-chain alcohol. In embodiments having a plurality of particle layers one above the other, all the particle layers are preferably applied first and then crosslinked and/or the film is formed from them together.

The amount of at least one film-forming aid in the aqueous composition—in particular in the bath—may preferably be 0.01 to 50 g/L, based on the solids including the active ingredients, especially preferably 0.08 to 35 g/L, most especially preferably 0.2 to 25 g/L or 0.5 to 16 g/L, in particular 1 to 12 g/L or 4 to 6 g/L. The weight ratio of the amounts of organic film-forming agent to the amounts of film-forming aids in the aqueous composition—in particular in the bath—may vary in a wide range and in particular may be ≤(100:0.1). This ratio is preferably in the range of 100:10 to 100:0.2 or from 100:2.5 to 100:0.6, especially preferably in the range of 100:2 to 100:0.75 or from 100:1.4 to 100:1.

It is often preferable here for the drying, film forming and/or crosslinking to take place in the temperature range of 50 to 260° C., especially preferably in the temperature range from 120 to 220° C., based on the oven temperature and/or based on the peak metal temperature (PMT). The selected temperature range depends largely on the type and amount of organic ingredients and optionally also the inorganic ingredients and optionally also their film-forming temperatures and/or crosslinking temperatures.

The invention preferably relates to a method in which the aqueous composition and/or the organic coating produced from it contains an amount of at least one complexing agent for metal cations or a polymer which is modified for complexing metal cations.

The method according to the invention is preferably one in which the aqueous composition and/or the organic coating produced from it contains at least one complexing agent selected from those based on maleic acid, alendronic acid, itaconic acid, citraconic acid or mesaconic acid or the anhydrides or hemiesters of these carboxylic acids.

The aqueous composition and/or the organic coating produced from it advantageously contain(s) at least one emulsifier.

It is especially preferable that the aqueous composition and/or the organic coating produced from it contain(s) at least one emulsifier, selected from those based on anionic emulsifiers.

The aqueous composition and/or the organic coating produced from it preferably contain(s) a mixture of at least two different anionic polyelectrolytes.

The aqueous composition and/or the organic coating produced from it especially preferably contain(s) a mixture of two pectins.

In addition, the aqueous composition and/or the organic coating produced from it also preferably contain(s) as the gelling agent at least one anionic polysaccharide selected from those with a degree of esterification and/or a degree of amidation of the carboxy function in the range of 5 to 75%, based on the total number of alcohol groups and carboxyl groups.

The aqueous composition and/or the organic coating produced from it most especially preferably contains as the gelling agent at least one anionic polysaccharide and/or at least one anionic polyelectrolyte selected from those having a molecular weight in the range of 500 to 1,000,000 g/mol$^{-1}$.

In the method according to the invention, it is especially preferable that the anionic polyelectrolytes are or have been modified with adhesion-imparting adhesive groups selected from the group consisting of chemical groups of multifunctional epoxies, isocyanates, primary amines, secondary amines, tertiary amines, quaternary amines, amides, imides, imidazoles, formamides, Michael reaction products, carbodiimides, carbenes, cyclic carbenes, cyclocarbonates, multifunctional carboxylic acids, amino acids, nucleic acids, methacrylamides, polyacrylic acids, polyacrylic acid derivatives, polyvinyl alcohols, polyphenols, polyols having at least one alkyl or aryl radical, caprolactam, phosphoric acids, phosphoric acid esters, epoxy esters, sulfonic acids, sulfonic acid esters, vinyl sulfonic acids, vinyl phosphonic acids, catechol, silanes as well as the silanols and/or siloxanes produced from them, triazines, thiazoles, thiazines, dithiazines, acetals, hemiacetals, quinones, saturated fatty acids, unsaturated fatty acids, alkyds, esters, polyesters, ethers, glycols, cyclic ethers, crown ethers, anhydrides as well as acetylacetones and β-diketo groups, carbonyl groups and hydroxyl groups.

Ag, Al, Cu, Fe, Mg and/or Zn is/are advantageously selected as the cations that are/have been dissolved out of the metallic surface and/or that are/have been added to the aqueous composition.

The aqueous composition preferably also contains a crosslinking agent selected from the group consisting of silanes, siloxanes, phenolic resin types or amines in an amount of 0.01 g/L to 50 g/L.

The aqueous composition especially preferably contains a crosslinking agent selected from the group consisting of silanes, siloxanes, phenolic resin types or amines in an amount of 0.01 g/L to 50 g/L.

In another embodiment of the invention, the aqueous composition contains complex titanium and/or zirconium fluorides in an amount of 0.01 g/L to 50 g/L.

The aqueous composition especially preferably contains complex titanium and/or zirconium fluorides in an amount of 0.1 g/L to 30 g/L.

The aqueous composition and/or the organic coating produced from it most especially preferably also contain(s) at least one additive selected from additives consisting of the group of foam suppressants, biocides, dispersion aids, film-forming aids, acidic and/or basic additives for adjusting the pH and thickeners and flow control agents.

Before bringing the metallic surfaces in contact with an aqueous composition and coating the metallic surfaces with the aqueous composition in process step II, the metallic surfaces are most especially preferably cleaned, pickled and/or pretreated.

The aqueous composition advantageously forms a coating based on ionogenic gel in which the dry film which is formed then or later has a thickness of at least 1 μm.

The organic coating especially preferably is formed in 0.05 to 20 minutes in an immersion bath and has a dry film thickness in the range of 5 to 100 μm after drying.

The invention also relates to an aqueous composition containing 30 to 80 wt % of at least one nonionically stabilized binder and 0.001 to 20.0 wt % of a gelling agent, wherein the aqueous composition has a pH in the range of 0.5 to 7.

The aqueous composition is preferably a composition that contains in the dispersion of film-forming polymers an amount of organic particles based on polyacrylates, polyurethanes, polyepoxides and/or their hybrids, an amount of at least one complexing agent selected from those based on maleic acid, alendronic acid, itaconic acid, citraconic acid or mesaconic acid or anhydrides or hemiesters of these carboxylic acids and at least one anionic polyelectrolyte based on pectins or gellan gum.

It has been found that closed or essentially closed coatings having a layer thickness in the range of 1 μm to 250 μm, in particular in the range of 3 μm to 100 μm or 5 μm to 50 μm, can then be prepared from the surfaces coated according to the invention. The individual coatings may have corresponding layer thicknesses before and/or after their film-forming step and/or before their crosslinking.

It has been found that the surfaces coated according to the invention, from which closed or essentially closed coatings are subsequently formed, can be produced by much simpler and much less expensive methods than, for example, electro dip coatings, autophoretic dip coatings or powder coatings.

Furthermore, it has been found that such coatings produced according to the invention may be equivalent in properties to the electro dip coatings, autophoretic dip coatings or powder coatings of industrial practice today if formulations corresponding to a chemical composition in particular are used.

It has surprisingly been found that the method according to the invention, which is not or essentially not an electrolytic method, even in the event that it is supported to a minor extent by electric voltage, and therefore it is not usually necessary for an external electric voltage to be applied, can be operated easily without complex controls. This method can be used in a broad temperature range and even at room temperature if the subsequent drying is omitted.

It has surprisingly been found that, in the case of the method according to the invention, no complex control measures are required with respect to the application of the activating means in order to achieve a uniform and homogeneous coating and that high quality protective follow-up coatings are formed with a low consumption of chemicals, these coatings achieving thickness in the range of 500 nm to 30 μm.

It has surprisingly been found that the method according to the invention is a self-regulating method with regard to the deposition of the follow-up coating in particular and that no complex control measures are necessary in this method and high quality protective coatings are formed with a low consumption of chemicals.

It has surprisingly been found that the follow-up coatings deposited according to the invention form a homogenous layer with a uniform dry layer thickness even on a workpiece having a complex shape, and that these coatings are comparable in quality to a traditional paint layer applied by traditional electrophoretic or autophoretic deposition methods.

The coating according to the invention can preferably be used for coated substrates as wire, wire mesh, strip, sheet metal, profile, lining, parts for a vehicle or a flying object, elements for a household appliance, elements in construction, frameworks, guide rails, heating elements or fence elements, molded parts of a complex geometry or small parts such as screws, nuts, flanges or springs. It is especially preferably used in automotive engineering, construction, for appliance building, for household appliances or in the heating sector. Use of the method according to the invention is especially preferred for coating substrates, which have posed problems in coating with an electro dip coating.

EXAMPLES

I. Substrates:
1. Cold-rolled, pass-through annealed steel without any other alloy ingredients according to DIN EN 10130 and with a sheet metal thickness of approximately 0.7-0.8 mm.
2. Electrolytically galvanized steel according to DIN EN 10153 and having a zinc layer of 75 g/m$^2$ and a sheet metal thickness of approximately 0.7-0.8 mm.
3. Aluminum as an AlMgSi alloy according to the standard AA 6014 and having a sheet metal thickness of approximately 1.2 mm.
4. Rod of beech wood II. Cleaning:
The substrates are cleaned with an alkaline standard cleaner from the company Chemetall consisting of 30 g/L Gardoclean® S5176 and 4 g/L Gardobond® Additive H 7406 in tap water. The pH is adjusted to 10.5-10.8 with Gardobond® Additive H7143. The cleaning is done by spraying for 3 minutes at 60° C. and 0.6 bar. Next the sheet metal plates are rinsed thoroughly by dipping them in tapwater and deionized water.

III. Silicate Coating:

To produce the silicate-based pretreatment, 2.9 g/L Gardobond® Additive H7107 and 22 g/L Gardobond® Oxsilan® Additive 9906 from the company Chemetall are added to deionized water as the starting solution. Then the pH is adjusted to 4.5 with Gardobond® Oxsilan® Additive 9951, and 125 g/L Snowtex® O from the company Nissan Chemical is added. At the end, the mixture is topped off with deionized water and the bath is adjusted to a pH of 4.0 with dilute nitric acid.

To incorporate polyvalent cations into the silicate coating during preparation, they must be added to the starting mix of deionized water before the other ingredients (see above).

The substrates are treated in the immersion bath at 40° C. for the period of time specified in the examples and subsequently rinsed thoroughly for 2 minutes at room temperature in deionized water unless a different period of time is specified. In addition, the coatings produced in this form can optionally be dried before the following treatment without any loss of reactivity for the following coating step.

IV. Deposition of Organic Formulation:

The treated substrates are [treated] at room temperature for the period of time specified in the examples in an organic formulation based on ionogenic gelation according to the specification WO002013117611A1; the full content of this patent specification is herewith included, to check whether the metal cations in the silicate coating are sufficient to deposit the coating. Next the coated substrates are rinsed thoroughly in deionized water. The coating is dried in a circulating air oven for 5 minutes at 170° C. The resulting thickness of the overall coating is evaluated gravimetrically or by means of an eddy current measurement.

V. X-Ray Fluorescence Analysis:

To characterize the silicate coating, x-ray fluorescence analysis is used. The silicon and zirconium contents provide information about the layer thickness while calcium, magnesium or zinc provide information about the amount of cations incorporated into the layer.

General Description of Experiments:

Substrates 1 through 3 were pretreated with an alkaline spray cleaner according to point II, then subjected to a silicate-based pretreatment according to point III and then coated with the organic formulation described according to point IV.

Comparative Example 1

Substrate 1 was coated with the organic formulation defined according to point IV by immersion for 5 minutes in the immersion bath without a silicate coating or metal ion incorporation according to point III. A dry film thickness of 20 µm was determined by using an eddy current measuring instrument.

Comparative Example 2

Substrate 2 was coated with the organic formulation defined according to point IV by immersion for 5 minutes in the immersion bath without a silicate coating or incorporation of metal ions according to point III. A dry film thickness of 41 µm was determined by using an eddy current measuring instrument.

Comparative Example 3

Substrate 3 was coated with the organic formulation defined according to point IV by immersion for 5 minutes in the immersion bath without a silicate coating or incorporation of metal ions according to point III. No dry film thickness was measured using an eddy current measuring instrument.

Comparative Example 4

Substrate 3 was subjected to a silicate-based pretreatment according to point III for 5 minutes without the addition of metal salts and then coated with the organic formulation defined according to point IV for 5 minutes. No dry film thickness could be measured with an eddy current measuring instrument; an amount of 622 mg/m$^2$ silicon and 55 mg/m$^2$ zirconium was determined by x-ray fluorescence analysis according to point V.

Example 1

Substrate 1 was subjected to a silicate-based pretreatment according to point III, with the addition of 24 g/L calcium nitrate tetrahydrate for five minutes and then coated with the organic formulation specified according to point IV for five minutes. A dry film thickness of 22 µm was measured using an eddy current measuring instrument, and the weight per unit of area was found to be 945 mg/m$^2$ silicon, 10 mg/m$^2$ zirconium and 5 mg/m$^2$ calcium by means of x-ray fluorescence analysis according to point V.

Example 2

Example 1 was repeated with substrate 2, and a dry film thickness of 44 µm was measured using an eddy current measuring instrument, and the weight per unit of area was found to be 1005 mg/m$^2$ silicon, 12 mg/m$^2$ zirconium and 9 mg/m$^2$ calcium by means of x-ray fluorescence analysis according to point V.

Example 3

Example 1 was repeated with substrate 3, and a dry film thickness of 11 µm was measured using an eddy current measuring instrument, and the weight per unit of area was found to be 1245 mg/m$^2$ silicon, 12 mg/m$^2$ zirconium and 10 mg/m$^2$ calcium by means of x-ray fluorescence analysis according to point V.

Example 4

Substrate 3 was subjected to a silicate-based pretreatment according to point III, with the addition of 47 g/L calcium nitrate tetrahydrate for five minutes, and then coated with the organic formulation described according to point IV for five minutes. A dry film thickness of 10 µm was measured using an eddy current measuring instrument, and the weight per unit of area was found to be 1505 mg/m$^2$ silicon, 12 mg/m$^2$ zirconium and 5 mg/m$^2$ calcium by means of x-ray fluorescence analysis according to point V.

Example 5

Example 4 was repeated, except that 71 g/L calcium nitrate tetrahydrate was used and a dry film thickness of 9 µm was measured using an eddy current measuring instrument, and the weight per unit of area was found to be 965 mg/m$^2$ silicon, 8 mg/m$^2$ zirconium and 5 mg/m$^2$ calcium by means of x-ray fluorescence analysis according to point V.

Example 6

Example 4 was repeated, except that 95 g/L calcium nitrate tetrahydrate was used and a dry film thickness of 2 μm was measured using an eddy current measuring instrument, and the weight per unit of area was found to be 116 mg/m$^2$ silicon, 2 mg/m$^2$ zirconium and <5 mg/m$^2$ calcium by means of x-ray fluorescence analysis according to point V.

Example 7

Substrate 3 was subjected to a silicate-based pretreatment according to point III, with the addition of 26 g/L magnesium nitrate hexahydrate for five minutes, and then coated with the organic formulation described according to point IV for five minutes. A dry film thickness of 3 μm was measured using an eddy current measuring instrument, and the weight per unit of area was found to be 800 mg/m$^2$ silicon, 60 mg/m$^2$ zirconium and 25 mg/m$^2$ magnesium by means of x-ray fluorescence analysis according to point V.

Example 8

Example 7 was repeated, except that 103 g/L magnesium nitrate hexahydrate was used and a dry film thickness of 5 μm was measured using an eddy current measuring instrument, and the weight per unit of area was found to be 1245 mg/m$^2$ silicon, 18 mg/m$^2$ zirconium and 15 mg/m$^2$ magnesium by means of x-ray fluorescence analysis according to point V.

Example 9

Substrate 3 was subjected to a silicate-based pretreatment according to point III, with the addition of 47 g/L zinc nitrate for five minutes, and then coated with the organic formulation described according to point IV for five minutes. A dry film thickness of 2 μm was measured using an eddy current measuring instrument, and the weight per unit of area was found to be 565 mg/m$^2$ silicon, 82 mg/m$^2$ zirconium and 25 mg/m$^2$ zinc by means of x-ray fluorescence analysis according to point V.

Example 10

Example 9 was repeated, except that 189 g/L zinc nitrate was used, and a dry film thickness of 8 μm was measured using an eddy current measuring instrument, and the weight per unit of area was found to be 1210 mg/m$^2$ silicon, 78 mg/m$^2$ zirconium and 50 mg/m$^2$ zinc by means of x-ray fluorescence analysis according to point V.

Example 11

Example 9 was repeated, except that 379 g/L zinc nitrate was used, and a dry film thickness of 0 μm was measured using an eddy current measuring instrument, and the weight per unit of area was found to be 63 mg/m$^2$ silicon, 2 mg/m$^2$ zirconium and 25 mg/m$^2$ zinc by means of x-ray fluorescence analysis according to point V.

Example 12

Substrate 3 was subjected to a silicate-based pretreatment according to point III, with the addition of 24 g/L calcium nitrate tetrahydrate for one minute, and then coated with the organic formulation described according to point IV for five minutes. A dry film thickness of 4 μm was measured using an eddy current measuring instrument, and the weight per unit of area was found to be 96 mg/m$^2$ silicon, 2 mg/m$^2$ zirconium and <5 mg/m$^2$ calcium by means of x-ray fluorescence analysis according to point V.

Example 13

Example 12 was repeated, except that the treatment time with calcium nitrate tetrahydrate was two minutes long. A dry film thickness of 5 μm was measured using an eddy current measuring instrument, and the weight per unit of area was found to be 300 mg/m$^2$ silicon, 3 mg/m$^2$ zirconium and <5 mg/m$^2$ calcium, determined by means of x-ray fluorescence analysis according to point V.

Example 14

Example 12 was repeated, except that the treatment time with calcium nitrate tetrahydrate was three minutes long. A dry film thickness of 13 μm was measured using an eddy current measuring instrument, and the weight per unit of area was found to be 665 mg/m$^2$ silicon, 6 mg/m$^2$ zirconium and <5 mg/m$^2$ calcium, determined by means of x-ray fluorescence analysis according to point V.

Example 15

Example 12 was repeated, except that the treatment time with calcium nitrate tetrahydrate was four minutes long. A dry film thickness of 15 μm was measured using an eddy current measuring instrument, and the weight per unit of area was found to be 1000 mg/m$^2$ silicon, 8 mg/m$^2$ zirconium and 5 mg/m$^2$ calcium, determined by means of x-ray fluorescence analysis according to point V.

Example 16

Example 12 was repeated, except that the treatment time with calcium nitrate tetrahydrate was ten minutes long. A dry film thickness of 20 μm was measured using an eddy current measuring instrument, and the weight per unit of area was found to be 1690 mg/m$^2$ silicon, 13 mg/m$^2$ zirconium and 10 mg/m$^2$ calcium, determined by means of x-ray fluorescence analysis according to point V.

Example 17

Example 12 was repeated, except that the treatment time with calcium nitrate tetrahydrate was five minutes long and then it was rinsed with deionized water for 60 minutes. A dry film thickness of 15 μm was measured using an eddy current measuring instrument, and the weight per unit of area was found to be 1470 mg/m$^2$ silicon, 15 mg/m$^2$ zirconium and <5 mg/m$^2$ calcium, determined by means of x-ray fluorescence analysis according to point V.

Example 18

Example 3 was repeated, except that the treatment time for the coating with the organic formulation described in point IV was 10 minutes long. A dry film thickness of 19 μm was measured using an eddy current measuring instrument, and the weight per unit of area was found to be 1245 mg/m$^2$ silicon, 12 mg/m$^2$ zirconium and 10 mg/m$^2$ calcium, determined by means of x-ray fluorescence analysis according to point V.

Example 19

Example 18 was repeated, except that the treatment time for the coating with the organic formulation described in point IV was 15 minutes long. A dry film thickness of 19 μm was measured using an eddy current measuring instrument, and the weight per unit of area was found to be 1245 mg/m² silicon, 12 mg/m² zirconium and 10 mg/m² calcium, determined by means of x-ray fluorescence analysis according to point V.

Example 20

Example 18 was repeated, except that the treatment time for the coating with the organic formulation described in point IV was 20 minutes long. A dry film thickness of 19 μm was measured using an eddy current measuring instrument, and the weight per unit of area was found to be 1245 mg/m² silicon, 12 mg/m² zirconium and 10 mg/m² calcium, determined by means of x-ray fluorescence analysis according to point V.

Example 21

Example 1 was repeated and a dry film thickness of 50 μm was determined gravimetrically.

All the micrographs show a homogenous layer was formed, indicating that this is a reliable, self-regulating and readily controllable coating method.

The invention claimed is:

1. A method for coating metallic surfaces of substrates, comprising the steps of:
   I. supplying a substrate having a cleaned metallic surface,
   II. coating the cleaned metallic surface with an aqueous composition in the form of a dispersion, suspension or a combination thereof of film-forming polymers consisting of a mixture of at least one stabilized polymer dispersion with a solids content of 30 to 80 wt % with a gelling agent in an amount of 0.001 to 20.0 wt %, based on the total mass of the resulting mixture as well as with cations, forming a coating based on an ionogenic gel,
   III. optionally rinsing the coating, drying the coating, baking the coating or a combination thereof, and
   IV. optionally forming another coating having a similar or additional coating composition before drying, baking, or a combination thereof,
   wherein
   between step I and step II, a coating is applied with an aqueous composition in the form of a dispersion, suspension, or a combination thereof based on a colloidal silicatic sol incorporating polyvalent metal cations and optionally a rinsing operation, wherein the polyvalent metal cations, when the aqueous composition includes a demineralized water, are added before the following other constituents: 0.725 g/L to 1.45 g/L of zinc nitrate and 0.22 g/L to 0.55 g/L of hexafluorozirconic acid and 0.66 g/L to 1.1 g/L of manganese nitrate adjusted to about pH 4.5 with sodium carbonate and 25 g/L of amorphous silica.

2. The method according to claim 1, characterized in that the gelling agent comprises:
   a) at least one polysaccharide based on glycogens, amyloses, amylopectins, calloses, agar, algins, alginates, pectins, carrageenan, celluloses, chitins, chitosans, curdlans, dextrans, fructans, collagens, gellan gum, gum arabic, starches, xanthans, gum tragacanth, karayans, tara gum or glucomannans;
   b) at least one anionic polyelectrolyte of natural origin, based on polyamino acids, collagens, polypeptides, or lignins;
   c) at least one synthetic anionic polyelectrolyte, based on polyamino acids, polyacrylic acids, polyacrylic acid copolymers, acrylamide copolymers, lignins, polyvinyl sulfonic acid, polycarboxylic acids, polyphosphoric acids or polystyrenes or combinations of a), b) or c).

3. The method according to claim 1, characterized in that the gelling agent comprises at least one polysaccharide, based on pectins, gellan gum or a combination thereof.

4. The method according to claim 1, characterized in that the aqueous composition, the coating or a combination thereof contain(s) a mixture of at least two different gelling agents.

5. The method according to claim 4, characterized in that the aqueous composition, the coating or a combination thereof contain(s) a mixture of two pectins.

6. The method according to claim 1, characterized in that the aqueous composition, the coating or a combination thereof contains at least one anionic polysaccharide, selected from those with a degree of esterification of the carboxyl function in the range of 5 to 75%, based on the total number of alcohol groups and carboxyl groups.

7. The method according to claim 1, characterized in that the aqueous composition, the coating or a combination thereof contains at least one anionic polysaccharide, at least one anionic polyelectrolyte or a combination thereof, selected from those with a molecular weight in the range of 500 to 1,000,000 g/mol.

8. The method according to claim 1, characterized in that the aqueous composition, the coating or a combination thereof contains at least one anionic polysaccharide, at least one anionic polyelectrolyte or a combination thereof, selected from those with a degree of amidation of the carboxyl functions in the range of 1 to 50% or a degree of epoxidation of the carboxyl functions of up to 80%.

9. The method according to claim 1, characterized in that the anionic polyelectrolytes are or have been modified with adhesion-promoting adhesive groups, selected from the group consisting of chemical groups of multifunctional epoxies, isocyanates, primary amines, secondary amines, tertiary amines, quaternary amines, amides, imides, imidazoles, formamides, Michael reaction products, carbodiimides, carbenes, cyclic carbenes, cyclocarbonates, multifunctional carboxylic acids, amino acids, nucleic acids, methacrylamides, polyacrylic acids, polyacrylic acid derivatives, polyvinyl alcohols, polyphenols, polyols having at least one alkyl and/or aryl radical, caprolactam, phosphoric acids, phosphoric acid esters, epoxy esters, sulfonic acids, sulfonic acid esters, vinyl sulfonic acids, vinyl phosphonic acids, catechol, silanes as well as the silanols, siloxanes or combination thereof produced from the former, triazines, thiazoles, thiazines, dithiazines, acetals, hemiacetals, quinones, saturated fatty acids, unsaturated fatty acids, alkyds, esters, polyesters, ethers, glycols, cyclic ethers, crown ethers, anhydrides as well as the acetylacetones and β-diketo groups, carbonyl groups and hydroxyl groups.

10. The method according to claim 1, characterized in that the aqueous composition, the coating or a combination thereof contains at least one complexing agent for metal cations or a polymer modified for complexing metal cations.

11. The method according to claim 10, characterized in that the aqueous composition, the coating or a combination thereof contains at least one complexing agent selected from those based on maleic acid, alendronic acid, itaconic acid, citraconic acid or mesaconic acid or the anhydrides or hemiesters of these carboxylic acids.

12. The method according to claim 1, characterized in that the aqueous composition, the coating or a combination thereof contains at least one type of cations, selected from those based on cationic salts, selected from the group consisting of melamine salts, nitroso salts, oxonium salts, ammonium salts, salts with quaternary nitrogen cations, salts of ammonium derivatives and metal salts of Ag, Al, B, Ba, Ca, Co, Cu, Fe, In, Mg, Mn, Mo, Ni, Pb, Sn, Ta, Ti, V, W, Zn, Zr or combinations thereof.

13. The method according to claim 12, characterized in that Ag, Al, Cu, Fe, Mg, Zn or combinations thereof are selected as cations that have been dissolved out of the metallic surface, added to the aqueous composition for incorporation into the silicate-modified polymer or a combination thereof.

14. The method according to claim 1, characterized in that the aqueous composition contains a crosslinking agent selected from the group consisting of: silanes, siloxanes, phenolic resin types or amines in an amount of 0.01 g/L to 50 g/L.

15. The method according to claim 1, characterized in that the aqueous composition contains complex titanium, zirconium fluorides or a combination thereof in an amount of 0.01 g/L to 50 g/L.

16. The method according to claim 15, characterized in that the aqueous composition contains complex titanium, zirconium fluorides or a combination thereof in an amount of 0.01 g/L to 30 g/L.

17. The method according to claim 1, characterized in that the aqueous composition contains an amount of at least one defoaming agent.

18. The method according to claim 1, characterized in that the aqueous composition contains at least one additive selected from the group, consisting of: pigments, biocides, dispersion aids, film-forming aids, acidic additives for adjusting the pH, basic additives for adjusting the pH, thickeners, flow control agents and combinations thereof.

19. The method according to claim 1, characterized in that the metallic surfaces are cleaned, pickled, pretreated or a combination thereof before contacting and coating the metallic surfaces with an aqueous composition in process step II.

20. The method according to claim 1, characterized in that the aqueous composition forms a coating based on an ionogenic gel, and the dry film formed then or later has a thickness of at least 1 μm.

21. The method according to claim 1, characterized in that the organic coating is formed in 0.05 to 20 minutes in the immersion bath and has a dry film thickness in the range of 5 to 100 μm after drying.

* * * * *